(12) United States Patent
Aldefeld et al.

(10) Patent No.: US 6,377,043 B1
(45) Date of Patent: Apr. 23, 2002

(54) MAGNETIC RESONANCE METHOD

(75) Inventors: Bernd Aldefeld; Hermann Schomberg; Dietrich Holz, all of Hamburg (DE)

(73) Assignee: US Philips Corporation, New York, NY (US)

( * ) Notice: Subject to any disclaimer, the term of this patent is extended or adjusted under 35 U.S.C. 154(b) by 0 days.

(21) Appl. No.: 09/355,491

(22) PCT Filed: Nov. 20, 1998

(86) PCT No.: PCT/IB98/01841

§ 371 Date: Jul. 28, 1999

§ 102(e) Date: Jul. 28, 1999

(87) PCT Pub. No.: WO99/28758

PCT Pub. Date: Jun. 10, 1999

(30) Foreign Application Priority Data

Nov. 29, 1997 (DE) .......................................... 197 53 093

(51) Int. Cl.[7] ................................................ G01V 3/00
(52) U.S. Cl. ........................................ 324/307; 324/309
(58) Field of Search ................................ 324/309, 307, 324/320, 322

(56) References Cited

U.S. PATENT DOCUMENTS

| 4,698,591 A | * | 10/1987 | Glover et al. ................ 324/307 |
| 4,950,994 A | * | 8/1990 | Glover et al. ................ 324/320 |

FOREIGN PATENT DOCUMENTS

| EP | 0 228 056 | * | 12/1986 |
| EP | 0 395 248 | * | 4/1989 |

* cited by examiner

*Primary Examiner*—Hezron Williams
*Assistant Examiner*—Brij B. Shrivastav

(57) ABSTRACT

The invention enables the temporal variation of the magnetic field generated by a gradient coil to be derived from the measured temporal variation of the current through this gradient coil and from a pulse response which has been determined once and stored for the relevant coil. In this case an inexpensive non-linear amplifier may be used in the gradient channel, and also a gradient coil with eddy current effects, without the reconstruction or the pulse design being degraded.

5 Claims, 3 Drawing Sheets

MAGNETIC RESONANCE METHOD

BACKGROUND OF THE INVENTION

MR methods (MR=magnetic resonance) require exact knowledge of the temporal variation of the magnetic field, notably of its spatially linearly varying component (gradient field). If this variation is not known, artefacts are liable to occur in M images upon reconstruction, and spatially selective RF pulses could excite the nuclear magnetization in a region other than the intended region.

For conventional MR methods it is assumed that the magnetic field, notably the gradient field, exhibits the desired temporal behavior which is imposed by a waveform generator. However, this is the case only if no eddy currents occur in the gradient coils required to generate the gradient fields and if the gradient amplifiers, delivering the currents for the gradient coils, are exactly linear.

In order to adapt the temporal variation of the gradient field to the desired variation despite eddy current losses, it is known from EP-B 228 056 to apply the gradient waveform or pulse shape to the gradient amplifier via a pre-emphasis filter having a transfer behavior which is the inverse of that of the gradient coil. The transfer behavior of the gradient coil is determined, during a preceding measuring operation, on the basis of its pulse response and the filter parameters are chosen in dependence on the measured values. However, this method can be effectively applied only if the entire chain of electronic components of the gradient channel can be considered to constitute a linear and temporally invariant system. Non-linear characteristics of the gradient amplifiers and temperature-dependent gain factors, however, oppose these requirements.

In a method which is known from Proc. ISMRM 1996, 1405, the currents in the gradient coils are measured and it is assumed that the temporal variation of the gradient field corresponds to the temporal variation of the measured current. However, in that case eddy current effects are not taken into account. According to another known method (SMR 94, 484) the magnetic field is measured directly in the magnet and the k-space trajectories are determined therefrom. It is a major drawback of such a method, however, that such a measurement must be performed separately for each MR sequence used. This-is a very time-consuming operation which precludes, inter alia, the changing at will of the MR pulse sequence during the data acquisition (for example, interactive MR).

SUMMARY OF THE INVENTION

It is an object of the present invention to provide a method enabling simple and accurate determination of the temporal variation of the magnetic field, notably of the gradient field.

This object is achieved by means of an MR method which includes the following steps:

measurement of the temporal variation of the current in or the voltage across a gradient coil, determination of the temporal variation of the magnetic field, generated by the gradient coil, from the measured temporal variation of the current (or of the voltage) and from the pulse response of the gradient coil, or from a quantity derived therefrom.

The invention is based on the recognition of the fact that the gradient coils themselves constitute linear systems exhibiting a temporally constant transfer behavior. Therefore, it suffices to measure the pulse responses of these systems only once; during later examinations merely the temporal variation of the current or of the voltage is measured and the temporal variation of the magnetic field is calculated from this variation and from the stored pulse response, for example by convolution of the current with the stored pulse response. This enables accurate determination of the temporal variation of the magnetic field. It is to be noted that no requirements whatsoever are imposed as regards the linearity of the gradient amplifier (therefore, use can be made of inexpensive amplifiers exhibiting given non-linearities). It is not essential either that the eddy current effects are particularly small, because they are taken into account in the pulse response which is measured only once.

In a further embodiment, the invention includes utilizing the more exact knowledge of the temporal variation of the spatially linearly varying component of the magnetic field (also referred to as gradient field hereinafter), as acquired according to the invention, so as to enhance the reconstruction. In customary methods the reconstruction is based on k-space trajectories which result from the desired variation of the gradient fields or from only one current measurement without taking into account the eddy currents. However, if the actual k-space trajectories do not correspond to these values, image artefacts occur. According to the invention the reconstruction is based instead on the actual k-space trajectories obtained by measurement and calculation. The k-space is then no longer scanned along the ideal k-space trajectories, but various methods (such as the so-called gridding method) also enable perfect reconstruction in such cases. No preparatory measurements which are dependent on the relevant MR sequence are required for this purpose.

Gradient coils having a less favorable construction are also capable of generating, in addition to the desired, spatially linearly varying components of the magnetic field, higher-order components which spatially vary as a function of the second or a higher power. Such components may also cause image defects. However, use of reconstruction methods which also take into account such components for reconstruction, can lead to improved reconstruction.

In a further embodiment, taking account of the temporal variation of the magnetic field enables the design of RF pulses which excite the nuclear magnetization in predetermined spatial regions only.

Claim 5 describes an MR device for carrying out the MR method the device including a main field magnet, gradient coil system, a memory for storing the pulse response of a quantity derived therefrom of each gradient coil, a receiver for receiving MR signals, and a reconstruction unit with at least one measuring unit for measuring the current in or the voltage across each gradient coil during an MR examination and with means for determining the spatial and temporal variation of the magnet field of the gradient coils from the measured values and the stored pulse sequences.

BRIEF DESCRIPTION OF THE DRAWING

The invention will be described in detail hereinafter with reference to the drawings. Therein.

DETAILED DESCRIPTION OF THE PREFERRED EMBODIMENT

Figure 1:
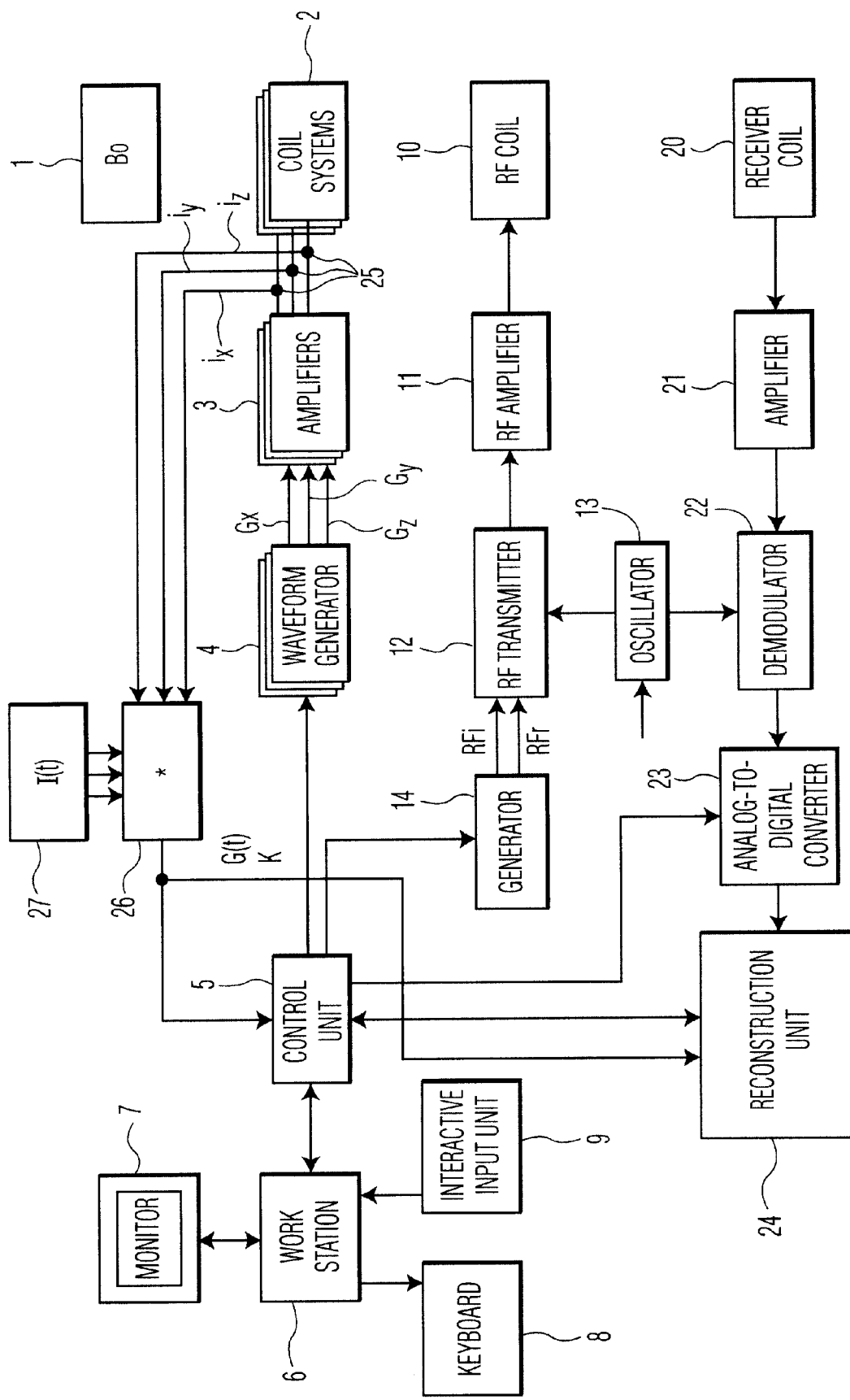
FIG. 1 shows a circuit diagram of an MR apparatus according to the invention.

The reference numeral 1 in FIG. 1 denotes a diagrammatically represented main field magnet which generates a steady, essentially uniform magnetic field of a strength of, for example 1.5 Tesla which extends in the z direction in an examination zone (not shown). The z direction extends horizontally and in the longitudinal direction of an examination table (not shown) on which a patient is accommodated during an MR examination.

Also provided is a gradient coil arrangement 2 which includes three coil systems which are capable of generating magnetic gradient fields $G_x$, $G_y$ and $G_z$ which extend in the z direction and have a gradient in the x, the y and the z direction, respectively. The temporal variation of the magnetic gradient fields is imposed by a waveform generator 4, that is to say separately for the x, the y and the z direction. The waveform generator 4 is controlled by an arithmetic and control unit 5 which, after the selection of the examination method (for example, an EPI sequence) and geometrical parameters thereof (for example, position of the slice to be imaged), calculates the required temporal variation of the magnetic gradient fields $G_x$, $G_y$, $G_z$ which is then loaded into the waveform generator.

These signals are read from the waveform generator during an MR examination and applied to amplifiers 3 which generate therefrom the currents $i_x$, $i_y$, $i_z$ required for the three coil systems of the gradient coil arrangement 2.

The control unit 5 also co-operates with a work station 6. The work station is provided with a monitor 7 for the display of MR images. Via a keyboard 8 or an interactive input unit 9, for example a light pen, entries can be made, for example the selection of the MR method to be used for an MR examination, the position of the slices to be imaged, etc.

The nuclear magnetization in the examination zone can be excited by RF pulses from an RF coil 10 which is connected to an RF amplifier 11 which amplifies the output signals of an RF transmitter 12. In the RF transmitter 12 the (complex) envelopes of the RF pulses are modulated with the carrier oscillations which are supplied by an oscillator 13 and whose frequency corresponds to the Larmor frequency (approximately 63 MHz in the case of a main magnetic field of 1.5 Tesla). The arithmetic and control unit 5 loads the (complex) envelope into a generator 14 which is coupled to the transmitter 12.

The MR signals generated in the examination zone are picked up by a receiver coil 20 and amplified by an amplifier 21. In a quadrature demodulator 22 the amplified MR signal is demodulated by two 90° offset carrier oscillations of the oscillator, yielding two signals which may be considered to be the real part and the imaginary part of a complex MR signal. These signals are applied to an analog-to-digital converter 23 which forms MR data therefrom, provided that it is not blocked by the control unit 5. The MR data is stored in a reconstruction unit 24 which reconstructs, in co-operation with the work station 6, MR images from the MR data derived from a plurality of MR signals, said MR images representing the nuclear magnetization in the examination zone.

According to the invention, the currents at the inputs of the three gradient coils 2 are measured by means of a respective current sensor 25 which thus supplies a signal which is proportional to the temporal variation of the currents $i_x(t)$, $i_y(t)$ and $i_z(t)$. In an arithmetic unit 26, the signals corresponding to the currents measured at the input of the gradient coils 2 are convoluted with the previously measured pulse responses (stored in a memory 27) of the systems formed by the three gradient coils for the x, the y and the z direction. The arithmetic unit 26 outputs a result in the form of the temporal variation of the magnetic fields produced by the gradient coils, but at least the gradient fields G(t), or the K-space values derived therefrom in known manner by integration, for the x, the y and the z direction, respectively. The values thus determined are applied to the reconstruction unit 24 in order to enhance the reconstruction and/or to the arithmetic unit 5 which derives therefrom the temporal variation of the envelope of the RF pulse or the magnetic gradient fields for spatially selective RF pulses.

The background and the execution of the method will be described in detail hereinafter with reference to the FIGS. 2 to 5.

It is known that the spatial and temporal variation of the magnetic field B generated by a (gradient) coil approximately satisfies the equation:

$$B(r, \vartheta, \varphi, t) \approx \sum_{n=0}^{N} \sum_{m=-n}^{+n} c_{nm}(t) Y_{nm}(r, \vartheta, \varphi) \tag{1}$$

Therein, t denotes the time and the values r, θ, φ denote the parameters of a spherical co-ordinate system centered at a co-ordinate origin. In this spherical co-ordinate system r denotes the distance between a measuring point and the co-ordinate origin, θ denotes the angle enclosed by the vector r, connecting the co-ordinate origin to the measuring point, with respect to the z axis, and φ denotes the angle enclosed by the projection of the vector onto the x-y plane with respect to the x axis. $Y_{nm}$ are the spherical functions and $c_{nm}(t)$ represent time-dependent coefficients which are capable of characterizing the coil completely. The approximation according to the equation 1 is better as N is larger.

The spherical functions $Y_{nm}(r,\theta,\phi)$ are defined by the equations $$Y_{nm}(r,\theta,\phi) = r^n P_{nm}(\cos\theta) \cos m\phi; \; m \geq 0 \tag{2}$$

or by $$Y_{nm}(r,\theta,\phi) = r^n P_{n-m}(\cos\theta) \sin |m|\phi; \; m<0 \tag{3}$$

The terms $P_{nm}(\cos\theta)$ therein represent the so-called associated Legendre functions of the argument cos θ.

Figure 2:
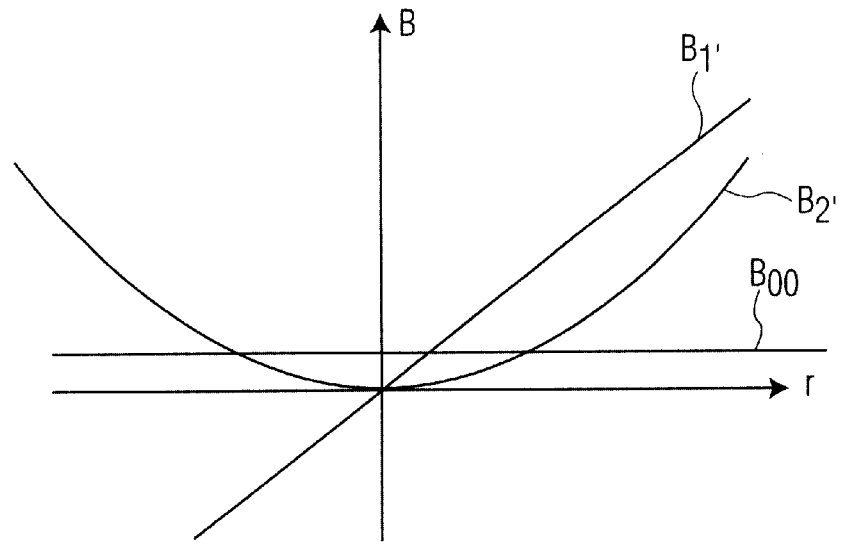
FIG. 2 shows the spatial variation of various components of the magnetic field of a (gradient) coil.
Figure 3:
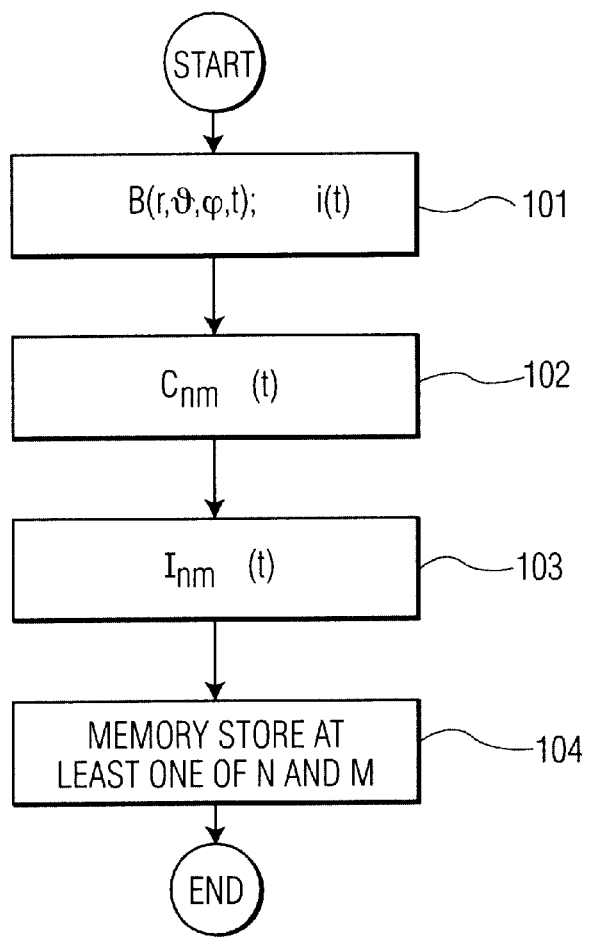
FIG. 3 shows the steps for determining the pulse response.

It follows from the equation 1 that the magnet field of each coil may be considered to be composed of a superposition of magnetic field components which in space do not vary at all, vary linearly or vary with a higher power as a function of r. Each summand defined by n, m at the right-hand side of the equation 1 may be considered to be a partial magnetic field which spatially varies in a given manner. This is shown in FIG. 2 in which the component $B_1$, defined by n=1, varies linearly in space, the component $B_2$, defined by n=2, varies quadratically in space, and the component $B_{00}$, defined by n=0, does not at all vary in space.

The time-dependent coefficients $c_{nm}(t)$ indicate the weight with which these partial magnetic fields are included in the overall magnetic field B. Generally speaking, gradient coils are proportioned in such a manner that only a single coefficient deviates from zero, for example the coefficient $c_{11}$ for the gradient coil for the x direction, whereas all other coefficients can be ignored in the ideal case.

The coefficients $c_{nm}$ can be calculated by means of a harmonic analysis (series expansion) when the temporal variation of the magnetic field B(r,θ,φ,t) is measured in a series of measuring points, for example on the surface of a sphere around the co-ordinate origin. Because $Y_{nm}(r,\theta,\phi)$ is generally known and $B(r,\theta,\phi,t)$ is obtained by the measurement, $c_{nm}(t)$ can be determined so that the magnetic field to be calculated by means of $c_{nm}(t)$ in conformity with the equation (1) corresponds as accurately as possible to the measured magnetic field. The number of measuring points at which the magnetic field $B(r,\theta,\phi,t)$ is to be determined is dependent on the number of magnetic field components whereby the measured field is to be approximated. The higher the number of such components, the higher the required number of measuring points will be.

It can be demonstrated that the time-dependent coefficients $c_{nm}(t)$ can be represented as follows:

$$C_{nm}(t) = I_{nm}(t) * i(t) \qquad (4)$$

Therein, the operator * represents the convolution and $I_{nm}(t)$ the partial pulse response of the coil for the magnetic field component defined by n, m, whereas i(t) is the current which generates the measured magnetic field $B(r,\theta,\phi,t)$ in the coil. Thus, $I_{nm}(t)$ represents the temporal variation of the relevant magnetic field component generated by the coil if the current through the coil varies temporally according to a delta function. Because $c_{nm}(t)$ can be calculated, as explained above, and because i(t) is known, the partial pulse response $I_{nm}(t)$ can be determined from the equation (4) by deconvolution or related methods. In conformity with the above explanations, the method for determining the pulse responses stored in the memory 27 thus includes the following steps:

First of all, in the first step (block 101) the temporal variation of the magnetic field $B(r,\theta,\phi,t)$ is measured at a number of measuring points which are preferably situated on a spherical surface; the current i(t) causing this magnetic field is measured at the same time (step 101). From the magnetic field thus measured and the known spherical functions $Y_{nm}$ there are determined the time-dependent coefficients $c_{nm}(t)$ in such a manner that the temporal variation of the magnetic field which can thus be calculated in conformity with the equation (1) corresponds as well as possible to the temporal variation of the magnetic field measured at the measuring points (step 102). In the step 103 for at least one component n, m the pulse response $I_{nm}(t)$ is determined from the time-dependent coefficients $c_{nm}(t)$ while using the equation (4). This component is stored in the memory 27 in the step 104, after which the method is repeated for the other gradient coils.

The method for calculating and storing the partial pulse responses need be executed only once if the gradient coils are not modified. During subsequent examinations the pulse responses thus stored are used for exact determination of the temporal variation of the magnetic fields generated by the gradient coils, notably their linearly varying gradient fields. For example, the reconstruction can be enhanced by means of the fields thus calculated.

Figure 4:
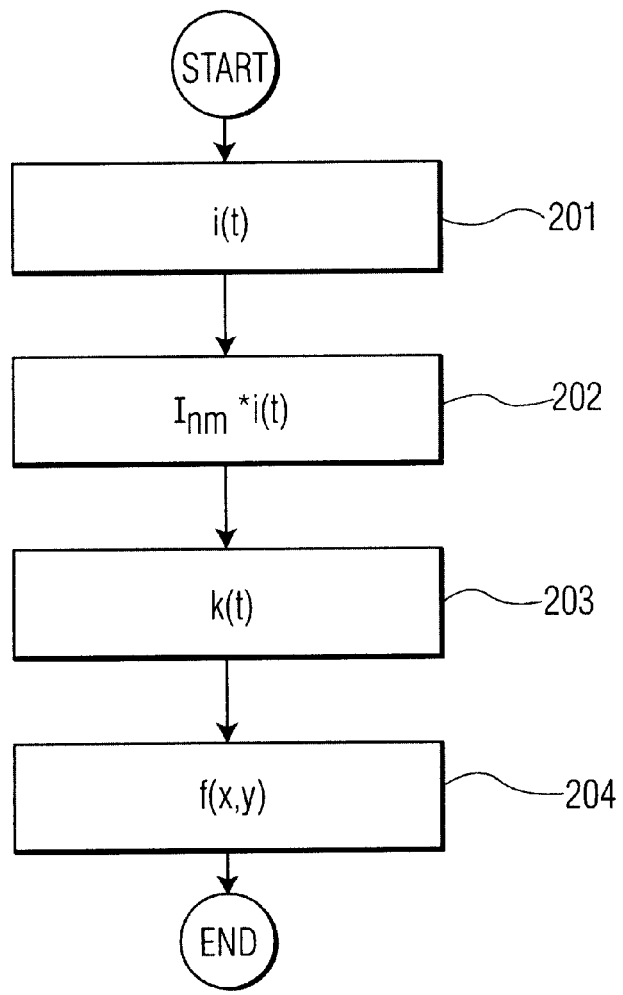
FIG. 4 shows the steps for reconstructing an MR image by means of the pulse response and the measured current variation.
Figure 5:
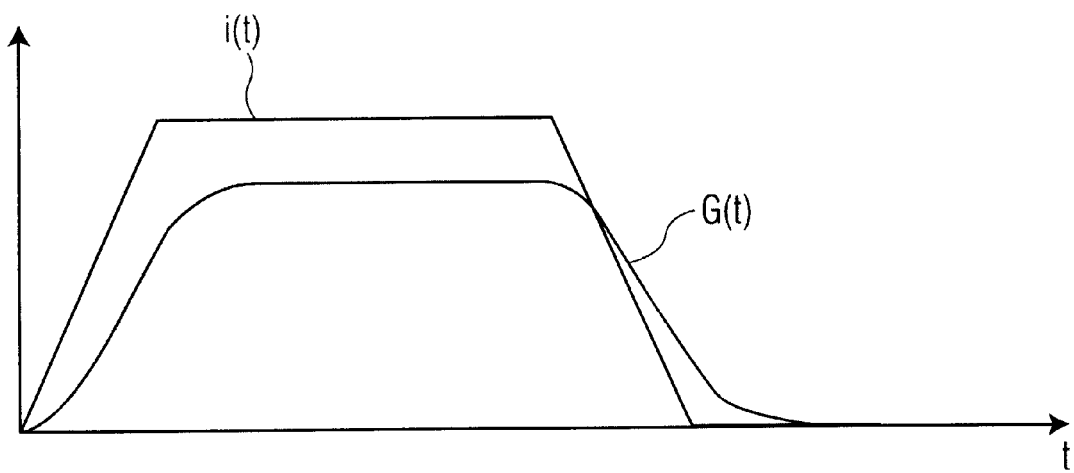
FIG. 5 shows the temporal variation of the current flowing in the gradient coil and of the gradient field generated thereby.

FIG. 4 shows the flow chart of a method which is suitable for this purpose. During the first step the spatial variations of the currents i(t) flowing through the gradient coils during an MR examination are measured (block 201). FIG. 5 shows a typical variation of the current i(t) through a gradient coil.

When the equation (4) is inserted in the equation (1) there is obtained:

$$B(r, \vartheta, \varphi, t) \approx \sum_{n=0}^{N} \sum_{m=-n}^{+n} [I_{nm}(t) * i(t)] Y_{nm}(r, \vartheta, \varphi) \qquad (5)$$

Because of $P_{11}(\cos\theta) = \sin\theta$ and $r \sin\theta \cos\phi = x$, for the magnetic field component with n=1, m=1 there is obtained:

$P_{11}(\cos\theta) = \sin\theta$ and $r \sin\theta \cos\phi = x$ $$B(x,t) = [I_{11}(t) * i(t)] x \qquad (6)$$

$B(x,t)$, therefore, is the temporal variation of a magnetic field with a constant gradient in the x direction. Thus, the calculation step 202 is performed in order to obtain the spatially constant gradient $G_x(t)[=I_{11}(t)*i(t)]$. The actual temporal variation of the gradient field $G_x(t)$ thus obtained is also shown in FIG. 5. It appears that, because of eddy current effects, G(t) is delayed relative to i(t).

Analogously, the gradient for the y direction is obtained by replacing the pulse response $I_{11}(t)$ in the equation (6) by $I_{1-1}(t)$, and the gradient for the z direction is obtained by replacing $I_{11}(t)$ in the equation 6 by $I_{10}(t)$.

After the temporal variation of the gradients $G_x(t)$, $G_y(t)$ and $G_z(t)$ generated by the gradient coils for the x, the y and the z direction has thus been determined in the step 202, the associated k values can be calculated (block 203) because, as is known, the k values represent the time integral over the gradients G(t). Using the k-space trajectories thus obtained, in the step 204 the nuclear magnetization distribution f(x,y) in the examination zone can be calculated, i.e. an MR image can be calculated. Because the scanning of the k-space in the step 203 generally deviates from the ideal shape, it is necessary to use a method which, like the known gridding method, does not require ideal scanning (at equidistant points in the k space) for the reconstruction.

Generally speaking, the gradient coils produce not only linear components but also higher-order components. Errors will occur if these components are no longer negligibly small and if the reconstruction utilizes a method which is based only on the temporal variation of the spatially constant gradients. Such errors can be eliminated by utilizing a reconstruction method which also takes into account higher-order components and by determining also these components in the step 203.

In the foregoing it was assumed that, in order to determine the temporal variation of a magnetic field generated by a gradient coil, the current flowing into said gradient coil is taken into account. It would in principle also be possible to measure instead the temporal variation of the voltage across the gradient coil. In that case, however, in the equation (4) or in the step 103 (FIG. 3) the pulse response $I_{nm}(t)$ would have to be derived from the calculated time-dependent coefficient $c_{nm}(t)$ and the measured temporal variation of the voltage. However, the measurement of the temporal variation of the current is to be preferred, because the magnetic field is linearly related to this current.

The pulse responses can be stored either as a series of numerical values or, after adaptation by means of one or more exponential functions, as a set of amplitude values with associated decay time constants. The latter offers the advantage that only a small amount of calculation work is required.

The actual variation of the magnetic field generated by the gradient coil can also be determined by means of the transfer function of the gradient coil; it is known that the transfer function can be derived from the pulse response by way of a Fourier transformation. The frequency spectrum of the magnetic field is obtained by multiplying the transfer function by the spectrum of the measured current (the latter spectrum is obtained from the measured temporal variation of the current by way of a Fourier transformation). When a further Fourier transformation is applied, the temporal variation of the magnetic field is obtained from the frequency spectrum of the magnetic field.

All references cited herein are incorporated herein by reference in their entirety and for all purposes to the same extent as if each individual publication or patent or patent application was specifically and individually indicated to be incorporated by reference in its entirety for all purposes.

What is claimed is:

1. An MR method comprising:

measuring the temporal variation of one of: a current (i(t)) passing through, and a voltage across a gradient coil, and determining the temporal variation of the magnetic field, generated by the gradient coil, from the measured temporal variation of the current and from one of: a pulse response ($I_{nm}(t)$) of the gradient coil, and from a quantity derived from the pulse response $I_{nm}(t)$.

2. An MR method as claimed in claim 1 further comprising:

determining the temporal variation of the spatially linearly varying component of the magnetic field, and reconstructing an MR image from MR data acquired by way of an MR measurement method, taking into account the magnetic gradient field component determined.

3. An MR method as claimed in claim 2 further comprising determining the temporal variation of the higher-order components of the magnetic gradient field which spatially varies as a function of one of: a second and a higher power, and taking these determined variations into account for the image reconstruction.

4. An MR method as claimed in claim 1, further comprising using the determined temporal variation of the magnetic field for design of location-selective RF pulses.

5. An MR apparatus for carrying out the method claimed in claim 1 comprising:

a main field magnet for generating a uniform, steady magnetic field, gradient coil systems for generating magnetic gradient fields with gradients extending in different directions, a memory for storing a pulse response, or a quantity derived therefrom, of each gradient coil, a receiver for receiving the MR signals generated in an examination zone, and a reconstruction unit for reconstruction of a nuclear magnetization distribution in the examination zone from corrected MR signals, the reconstructing unit including at least one measuring unit for one of: measuring the current in and the voltage across each gradient coil during an MR examination and means for determining the spatial and temporal variation of the magnetic field of the gradient coils from the measured values and the stored pulse responses, and wherein the reconstruction corrects the MR signals using the determined spatial and temporal variation.

* * * * *